(12) United States Patent
Böhm et al.

(10) Patent No.: US 9,147,806 B2
(45) Date of Patent: Sep. 29, 2015

(54) OPTOELECTRONIC SEMICONDUCTOR CHIP, METHOD OF FABRICATION AND APPLICATION IN AN OPTOELECTRONIC COMPONENT

(75) Inventors: Bernd Böhm, Obertraubling (DE); Gertrud Kräuter, Regensburg (DE); Andreas Plößl, Regensburg (DE)

(73) Assignee: OSRAM Opto Semiconductor GmbH (DE)

( * ) Notice: Subject to any disclaimer, the term of this patent is extended or adjusted under 35 U.S.C. 154(b) by 317 days.

(21) Appl. No.: 13/825,156

(22) PCT Filed: Sep. 15, 2011

(86) PCT No.: PCT/EP2011/066008
§ 371 (c)(1),
(2), (4) Date: Jun. 6, 2013

(87) PCT Pub. No.: WO2012/038318
PCT Pub. Date: Mar. 29, 2012

(65) Prior Publication Data
US 2014/0145228 A1    May 29, 2014

(51) Int. Cl.
*H01L 33/22* (2010.01)
*H01L 33/44* (2010.01)
(Continued)

(52) U.S. Cl.
CPC ............ *H01L 33/22* (2013.01); *H01L 31/0236* (2013.01); *H01L 31/02366* (2013.01); *H01L 31/054* (2014.12); *H01L 33/44* (2013.01);
(Continued)

(58) Field of Classification Search
CPC ... H01L 33/22; H01L 31/02366; H01L 33/58; H01L 31/0543; H01L 51/5275; H01L 51/5268
USPC ................... 257/98, 432, E33.067, E33.068, 257/E33.069, E33.074; 438/29, 32, 71
See application file for complete search history.

(56) References Cited

U.S. PATENT DOCUMENTS

| 4,746,366 A | 5/1988 | Philipp et al. |
| 2003/0141506 A1* | 7/2003 | Sano et al. ................. 257/78 |

(Continued)

FOREIGN PATENT DOCUMENTS

| DE | 34 07 087 A1 | 9/1985 |
| DE | 43 03 570 A1 | 8/1994 |

(Continued)

OTHER PUBLICATIONS

Nguyen Nhu Toan, "Spin-on Glass Materials and Applications in Advanced Technologies," Ph.D. Thesis, University of Twente, 1999.
(Continued)

*Primary Examiner* — Anthony Ho
*Assistant Examiner* — Samuel Lair
(74) *Attorney, Agent, or Firm* — DLA Piper LLP (US)

(57) ABSTRACT

An optoelectronic semiconductor chip includes an active layer with a first and a second major face, including a semiconductor material which emits or receives radiation when the semiconductor chip is in operation; a patterned layer including three-dimensional patterns for outcoupling or incoupling radiation and arranged on the first major face in a beam path of the radiation, wherein the patterned layer includes an inorganic-organic hybrid material.

13 Claims, 1 Drawing Sheet (51) Int. Cl.
*H01L 31/0236* (2006.01)
*H01L 31/054* (2014.01)

(52) U.S. Cl.
CPC .............. *H01L2224/32245* (2013.01); *H01L 2224/48091* (2013.01); *H01L 2224/48247* (2013.01); *H01L 2224/73265* (2013.01); *H01L 2933/0091* (2013.01); *Y02E 10/52* (2013.01)

(56) References Cited

U.S. PATENT DOCUMENTS

| | | | |
|---|---|---|---|
| 2005/0141240 A1* | 6/2005 | Hata et al. | 362/600 |
| 2006/0205237 A1 | 9/2006 | Kodama et al. | |
| 2006/0243947 A1 | 11/2006 | Tsumura et al. | |
| 2007/0284601 A1* | 12/2007 | Khanarian | 257/98 |
| 2008/0258156 A1 | 10/2008 | Hata | |
| 2008/0261340 A1* | 10/2008 | Matsuo et al. | 438/29 |
| 2010/0117070 A1* | 5/2010 | Adekore et al. | 257/43 |
| 2011/0155999 A1* | 6/2011 | Tansu et al. | 257/13 |

FOREIGN PATENT DOCUMENTS

| | | |
|---|---|---|
| DE | 199 29 591 A1 | 1/2001 |
| DE | 102 53 161 A1 | 3/2004 |
| EP | 2 157 624 A1 | 2/2010 |
| WO | 2007/031929 A1 | 3/2007 |

OTHER PUBLICATIONS

ACCUGLASS T-11 Spin-on Glass, Honeywell International Inc., www.electronicmaterials.com (Product Information).

ProTEK PSB "Photosensitive Alkaline-Protective Coatin," Brewer Science, www.brewerscience.com (Product Information).

* cited by examiner

OPTOELECTRONIC SEMICONDUCTOR CHIP, METHOD OF FABRICATION AND APPLICATION IN AN OPTOELECTRONIC COMPONENT

TECHNICAL FIELD

This disclosure relates to an optoelectronic semiconductor chip, a method of fabricating the semiconductor chip and an optoelectronic component comprising such a semiconductor chip.

BACKGROUND

The surface of optoelectronic semiconductor chips is often roughened to improve outcoupling or incoupling of radiation in the semiconductor chip. The roughened surface often includes patterns produced directly in the active layer of the semiconductor chip. It is in general desirable to couple radiation in or out as fully as possible to increase the efficiency of the semiconductor chip. Moreover, such a semiconductor chip should have a long storage life and be producible cheaply and with little effort.

It could therefore be helpful to provide an optoelectronic semiconductor chip with improved properties. It could also be helpful to provide a method of fabricating an optoelectronic semiconductor chip with improved properties and an optoelectronic component comprising such a semiconductor chip.

SUMMARY

We provide an optoelectronic semiconductor chip including an active layer with a first and a second major face including a semiconductor material which emits or receives radiation when the semiconductor chip is in operation, a patterned layer including three-dimensional patterns for outcoupling or incoupling radiation and arranged on the first major face in a beam path of the radiation, wherein the patterned layer includes an inorganic-organic hybrid material.

We also provide a method of producing the semiconductor chip including (a) providing a body including the active layer, wherein the active layer includes the first and second major faces, (b) applying a coating material to the first major face, (c) patterning the coating material, and (d) curing the coating material to yield the inorganic-organic hybrid material, thereby forming the patterned layer.

We further provide an optoelectronic component including the semiconductor chip.

We further yet provide an optoelectronic semiconductor chip including an active layer with a first and a second major face, including a semiconductor material which emits or receives radiation along a beam path when the semiconductor chip is in operation, a patterned layer including three-dimensional patterns for outcoupling or incoupling radiation and arranged on the first major face in the beam path, wherein the patterned layer includes an inorganic-organic hybrid material, the inorganic-organic hybrid material including a hydrolytic condensation product, and an organic prepolymer, wherein the hydrolytic condensation product contains organofunctional silanes with organic substituents which are at least in part cross-linked with the organic prepolymer.

DETAILED DESCRIPTION

We provide an optoelectronic semiconductor chip which may comprise:
   an active layer with first and second major faces, wherein the active layer comprises or consists of a semiconductor material and emits or receives radiation when the semiconductor chip is in operation;
   a patterned layer comprising three-dimensional patterns for outcoupling or incoupling of radiation and arranged on the first major face in the beam path of the active layer,
wherein the patterned layer comprises or consists of an inorganic-organic hybrid material.

The optoelectronic semiconductor chip is also designated for short below as the "semiconductor chip." In this context, receiving radiation means that the semiconductor chip may be used to detect radiation.

The three-dimensional patterns in particular improve the outcoupling and/or incoupling of radiation by reducing total reflection at the surface of the semiconductor chip.

The patterned layer is arranged at least in part on the first major face of the active layer and may be arranged solely on the first major face. It may also completely cover the first major face of the active layer wherein, for example, a region intended to electrically contact the semiconductor chip may be recessed. The patterned layer may close or seal defects in the active layer, for example, point defects, cracks or indeed microtubes. This may also apply to a region of the first major face intended for electrical contact. The active layer may therefore be protected from harmful influences, whereby the semiconductor chip exhibits a longer service life than is the case with conventional semiconductor chips, in which a surface of the active layer is directly roughened for outcoupling or incoupling of radiation. Defects which extend through the entire active layer may also be closed or sealed by the patterned layer, whereby the risk of short-circuiting is reduced when the semiconductor chip is in operation.

The choice of semiconductor materials is not restricted. Semiconductor materials are used, in particular, which emit and/or receive radiation in the visible range of the spectrum (420 to 780 nm wavelength). Moreover, semiconductor materials may be used which emit and/or receive in the UV range (200 to 420 nm wavelength) or in the infrared range (≥780 nm wavelength). Such a semiconductor material may be based, for example, on nitride or phosphide compound semiconductors or comprise or consist of GaAs or SiC. Moreover, the semiconductor material may, for example, be based on antimonide, arsenide or II/VI compound semiconductors. Combinations of the semiconductor materials may also be used.

"Based on nitride compound semiconductors" means that the active layer or at least one layer thereof comprises a nitride III-V compound semiconductor material, preferably $Al_nGa_mIn_{1-n-m}N$, wherein $0 \leq n \leq 1$, $0 \leq m \leq 1$ and $n+m \leq 1$. This material does not absolutely have to exhibit a mathematically exact composition according to the above formula. Instead, it may comprise one or more dopants and additional constituents which do not substantially modify the characteristic physical properties of the $Al_nGa_mIn_{1-n-m}N$ material. For simplicity's sake, however, the above formula includes only the fundamental constituents of the crystal lattice (Al, Ga, In, N), even if these may in part be replaced by small quantities of further substances.

"Based on phosphide compound semiconductors" means that the semiconductor body, in particular the active layer, preferably comprises $Al_nGa_mIn_{1-n-m}P$, wherein $0≤n≤1$, $0≤m≤1$ and $n+m≤1$, preferably with $n≠0$ and/or $m≠0$. This material need not necessarily exhibit a mathematically exact composition according to the above formula. Instead, it may comprise one or more dopants and additional constituents which do not substantially modify the physical properties of the material. For simplicity's sake, however, the above formula includes only the fundamental constituents of the crystal lattice (Al, Ga, In, P), even if these may in part be replaced by small quantities of further substances.

"Based on antimonide compound semiconductors" means that the semiconductor body, in particular the active region, preferably comprises $Al_nIn_mGa_{1-n-m}Sb$, wherein $0≤n≤1$, $0≤m≤1$ and $n+m≤1$. This material need not necessarily exhibit a mathematically exact composition according to the above formula. Instead, it may comprise one or more dopants and additional constituents which do not substantially modify the physical properties of the material. For simplicity's sake, however, the above formula includes only the fundamental constituents of the crystal lattice Al, In, Ga, Sb, even if these may in part be replaced by small quantities of further substances.

"Based on arsenide compound semiconductors" means that the semiconductor body, in particular the active region, preferably comprises $Al_nIn_mGa_{1-n-m}As$, wherein $0≤n≤1$, $0≤m≤1$ and $n+m≤1$. This material need not necessarily exhibit a mathematically exact composition according to the above formula. Instead, it may comprise one or more dopants and additional constituents which do not substantially modify the physical properties of the material. For simplicity's sake, however, the above formula includes only the fundamental constituents of the crystal lattice Al, In, Ga, As, even if these may in part be replaced by small quantities of further substances.

"Based on II-VI compound semiconductors" means that the semiconductor body, in particular the active region, preferably comprises $Zn_nCd_{1-n}S_mSe_{1-m}$, wherein $0≤n≤1$ and $0≤m≤1$. This material need not necessarily exhibit a mathematically exact composition according to the above formula. Instead, it may comprise one or more dopants and additional constituents which do not substantially modify the physical properties of the material. For simplicity's sake, however, the above formula includes only the fundamental constituents of the crystal lattice Zn, Cd, S, Se, even if these may in part be replaced by small quantities of further substances. The II-VI compound semiconductors comprise sulfides and selenides.

The active layer may be epitaxially grown at least in part. The active layer may also be completely epitaxially grown. Epitaxially grown regions may at least in part be monocrystalline.

Such an epitaxial layer may be produced, for example, "by metal organic chemical vapor deposition" (MOCVD). As a rule, this method is very costly and labor-intensive since the metalorganics used, for example, $Me_3Ge$ or $Me_3Al$ are generally expensive, susceptible to hydrolysis and in part even pyrophoric. Some chemicals, for example, ammonia or hydrazine as nitrogen source are in turn corrosive and/or toxic. The chemicals stated here by way of example may be used for epitaxial production of InGaN. Suitable chemicals are likewise commercially obtainable for other semiconductor materials.

In the semiconductor chip, the active layer may exhibit a smaller layer thickness than conventional semiconductor chips while using the same materials and emitting or receiving the same amount of radiation. Production costs are thus reduced compared to conventional semiconductor chips since less material, in particular epitaxially grown material, is needed for fabrication. In conventional semiconductor chips, on the other hand, three-dimensional patterns are produced, for example, by etching into the active layer, i.e., using a subtractive method. Parts of the epitaxial material, which were initially costly to apply, are thus removed again. The regions in which three-dimensional patterns are produced then contribute only marginally to the emission or reception of radiation.

The active layer may comprise a plurality of layers and may take the form of a layer stack. At least one of the layers is grown epitaxially in the layer stack. A plurality of or indeed all the layers may be grown epitaxially, wherein the individual layers comprise or consist of the same or different semiconductor materials.

The patterned layer is in particular transparent to the radiation emitted or received by the semiconductor chip. "Transparent" means that the patterned layer exhibits a transparency of ≥85%, in particular ≥90%. The transparency may be ≥95%. The transparency is determined by transmission measurements. Fresnel losses which arise on entry or exit of radiation (in each case approx. 4%) are not taken into account here.

Moreover, the patterned layer is in particular resistant to the radiation used. Therefore, the patterned layer is not degraded by the radiation used and/or no or barely any transparency losses arise during operation. Over the average service life of the semiconductor chip the patterned layer exhibits at least 70%, in particular at least 80%, of its original transparency. Beyond the average service life of a semiconductor chip, it still exhibits approximately 70% of its original brightness. Thus, the patterned layer, which comprises or consists of an inorganic-organic hybrid material, differs fundamentally from a layer which contains a photoresist and is used, for example, as a mask in an etching process. Conventionally, in the case of conventional semiconductor chip such a photoresist-containing layer is also removed again after an etching process.

A reflective layer may be arranged on the second major face of the active layer. The reflective layer may also be arranged directly on the active layer. The reflective layer may be flat or patterned. Radiation may be reflected at least in part by the reflective layer such that the radiation may then be coupled out of the semiconductor chip or detected in the active layer, thereby increasing the efficiency of the semiconductor chip.

The reflective layer may comprise or consist of a metal. The metal may for, example, be selected from a group comprising silver, platinum, aluminium and combinations or alloys of these metals. The alloys may also contain proportions of other metals. The reflective layer may in particular comprise or consist of silver or silver alloys.

Arranging or applying a first layer, a first region or a first device "on" a second layer, a second region or a second device may mean that the first layer, the first region or the first device is arranged or applied directly in direct mechanical and/or electrical contact on the second layer, the second region or the second device or to the two further layers, regions or devices. Furthermore, indirect contact is also possible, in which case further layers, regions and/or devices are arranged between the first layer, the first region or the first device and the second layer, the second region or the second device or the two further layers, regions or devices.

On the second major face or between the second major face and the reflective layer, a barrier layer may be produced to at least partly stop migration of metals, for example, silver from the reflective layer into the active layer. The barrier layer may be arranged directly on the second major face. Such a barrier layer may comprise or consist of TiWN, for example.

The three-dimensional patterns for outcoupling or incoupling of radiation may be present only in the patterned layer. As a consequence, the active layer does not comprise any such three-dimensional patterns. The first major face on which the patterned layer is arranged may therefore be planar or virtually planar. Virtually planar means that the first major face exhibits a roughness with extreme values of ≤50 nm and in particular ≤20 nm relative to a 5 µm*5 µm region or may also be completely planar. This may be determined using a scanning force microscope (atomic force microscope, AFM).

The active layer may have a layer thickness of ≤10 µm and in particular of ≤5 µm. The active layer may have a layer thickness of 0.4 to 2 µm, in particular of 0.6 to 1.5 µm and often of 0.8 to 1.2 µm, for example 1 µm. The semiconductor chip may thus be, for example, a thin-film light-emitting diode chip.

The patterned layer may have a layer thickness of 0.5 to 3 µm, in particular of 0.6 to 1.5 µm. The patterned layer may have a layer thickness of 1.1 µm, for example.

The three-dimensional patterns may exhibit a defined shape. The shape of the three-dimensional patterns is not limited. They may be photonic crystal structures and/or geometric shapes optimised by calculation or simulation, for example.

The shape of the three-dimensional patterns may be selected such that either radiation impinging on the surfaces of the patterned layer is coupled out directly or totally reflected radiation impinges, after re-reflection at the opposite side of the semiconductor chip, for example, at a reflective layer, on second impingement on the surface of the patterned layer, on the surface at such an angle that total reflection does not occur. This increases radiation extraction from the semiconductor chip or the efficiency of a radiation-emitting semiconductor chip. Such three-dimensional patterns improve radiation incoupling in the case of a radiation-receiving conductor chip.

The three-dimensional patterns in the patterned layer may be selected from a group comprising pyramidal, prismatic, cuboidal, frustopyramidal, conical, frustoconical patterns and combinations thereof. The three-dimensional patterns are in particular arranged close together.

The three-dimensional patterns may be formed with a resolution of ≤3 µm and in particular 0.08 to 2 µm. The three-dimensional patterns in this respect frequently exhibit a resolution of 0.5 to 2 µm. Three-dimensional patterns formed, for example, as photonic crystals may also exhibit a resolution of ≤0.5 µm, for example, 0.1 to 0.3 µm such that the resolution is in the range from a quarter to a half wavelength of the visible radiation.

The patterned layer may exhibit recesses between the three-dimensional patterns. The shape of these recesses may be as desired and depends above all on the three-dimensional pattern. Such a recess may be, but does not have to be, defined on all lateral sides by the patterned layer.

The recesses in the patterned layer at least in part may have a depth of 0.5 to 2.8 µm, in particular 0.6 to 1.4 µm, for example, 1 µm. In the region of such a recess, the layer thickness of the patterned layer may amount to at least 5 nm, in particular at least 20 nm, the layer thickness generally being ≤50 nm. The patterned layer may thus also be free of holes in the region of the recesses (between the patterns) such that the active layer is protected or defects in the active layer are closed or sealed at least in part. The active layer may also not be covered, at least in part, by the patterned layer, for example, in a region in which it is intended for the semiconductor chip to be electrically contacted.

The inorganic-organic hybrid material may comprise:
an organic prepolymer and
a hydrolytic condensation product,
wherein the hydrolytic condensation product contains organofunctional silanes with organic substituents at least in part crosslinked with the organic prepolymer. The inorganic-organic hybrid material, which is sometimes also known as inorganic-organic hybrid polymer, may consist for the most part, which corresponds to a content of at least 90 wt. %, or completely of an organic prepolymer and a hydrolytic condensation product.

Production of such an inorganic-organic hybrid material is described, for example, in DE 43 03 570 C2 and the references mentioned therein, the subject matter of which is hereby incorporated by reference.

The hydrolytic condensation product may be produced from condensable compounds which are at least partly hydrolysed and then condensed to yield the hydrolytic condensation product. The condensable compounds are selected at least in part from organofunctional silanes of the formula $R'''_m SiX_{4-m}$. An organofunctional silane or a combination of different organofunctional silanes of this formula may be used, the following meanings being assigned:
$R'''$=crosslinkable organic substituent,
$X$=hydrolyzable and condensable group,
$m$=1, 2 or 3, in particular 1.

Organofunctional silanes of the formula $R'''_m SiX_{4-m}$ and the meanings of $R'''$ and $X$ are described in detail in DE 43 03 570 C2, the subject matter of which is hereby incorporated by reference. In the hydrolytic condensation product organofunctional silanes with crosslinkable organic substituents are produced from organofunctional silanes of formula $R'''_m SiX_{4-m}$. In the inorganic-organic hybrid material these organic substituents are at least partly crosslinked with the organic prepolymer.

The hydrolytic condensation product may be produced using further condensable compounds selected from condensable compounds of formula $MY_4$ of titanium and/or zirconium and combinations of these compounds. M here denotes the metal titanium (Ti) or zirconium (Zr). Y denotes a hydrolyzable and condensable group, wherein a plurality of instances of Y may also correspond to a chelate ligand. Chelate ligands such as, for example, β-diketones may increase the stability of these compounds. Y may be individually selected in each compound, a compound of formula $MY_4$ thus being able to comprise up to 4 different instances of Y. Suitable titanium and/or zirconium compounds of formula $MY_4$ for the inorganic-organic hybrid material are described in DE 34 07 087 A1, the subject matter of which is hereby incorporated by reference.

The hydrolytic condensation product may be produced using further condensable compounds selected from organofunctional silanes of formula $R'_m SiX_{4-m}$, wherein $R'$ is a non-crosslinkable organic residue. Moreover, the hydrolytic condensation product may be producible using further condensable compounds selected from low-volatility oxides, for example, $B_2O_3$, $P_2O_5$ and $SnO_2$. Organofunctional silanes of formula $R'_m SiX_{4-m}$ and low-volatility oxides are described in DE 43 03 570 C2 and the references stated therein, the subject matter of which is hereby incorporated by reference in this respect.

A hydrolytic condensation product may be produced using a sol-gel method from the condensable compounds which may each also correspond to a combination of different condensable compounds. The hydrolytic condensation product may be produced completely by condensing the above-described condensable compounds.

Suitable crosslinkable organic prepolymers are described in DE 43 03 570 C2, for example, the subject matter of which is hereby incorporated by reference.

Alternatively, the inorganic-organic hybrid material may comprise a second hydrolytic condensation product produced from condensable compounds, which are optionally hyrolyzed at least in part and then condensed. The inorganic-organic hybrid material may consist completely of the second hydrolytic condensation product. The condensable compounds comprise organofunctional silanes of formula $R'_m SiX_{4-m}$ with $1 \leq m \leq 3$ and in particular $m=1$.

In this respect, R' is a non-crosslinkable organic residue, which remains in the inorganic-organic hybrid material. Furthermore, X is a hydrolyzable and/or condensable group, which does not remain (completely) in the inorganic-organic hybrid material. Organofunctional silanes of formula $R'_m SiX_{4-m}$ are described, for example, in DE 43 03 570 C2 and the references stated therein, the subject matter of which is hereby incorporated by reference. X may be selected from a group comprising alkoxy, hydroxy, chloride and combinations thereof. R' may in particular be selected from a group comprising alkyl substituents with up to 8 carbon atoms, aryl substituents and combinations thereof. R' may, for example, be selected from a group comprising methyl, ethyl, propyl, isopropyl, cyclohexyl, phenyl and combinations thereof. Combinations of different organofunctional silanes of formula $R'_m SiX_{4-m}$ may also be used.

The condensable compounds for producing the second hydrolytic condensation product may comprise titanium and/or zirconium compounds of formula $MY_4$, as have already been described above. Oxides and hydroxides of titanium and/or zirconium may also be used.

The condensable compounds for producing the second hydrolytic condensation product may comprise silicon compounds of formula $SiX_4$. Here, X has the same meaning as previously explained.

From the organofunctional silanes of formula $R'_m SiX_{4-m}$ and optionally the titanium and/or zirconium compounds of formula $MY_4$ and optionally silicon compounds of formula $SiX_4$, it is possible, using a sol-gel method, to produce a second hydrolytic condensation product which can be stored for at least several months without quality loss. This second hydrolytic condensation product is not as yet completely condensed and therefore still contains Si—OH groups and optionally Ti—OH and/or Zr—OH groups. By curing the second hydrolytic condensation product, it is possible to obtain the actual inorganic-organic hybrid material.

The inorganic-organic hybrid material may be "spin-on" glass.

The inorganic-organic hybrid material may comprise nanoparticles containing or consisting of $TiO_2$ and/or $ZrO_2$.

The patterned layer may have a refractive index of $\geq 1.6$. A high refractive index allows good outcoupling of radiation since little total reflection occurs at the first major face.

The patterned layer may have a refractive index of $\geq 1.8$ and in particular of $\geq 1.9$. The refractive index may be $\geq 2.0$, for example, 2.2. The refractive index may be selected to be as high as possible, to increase outcoupling from the semiconductor chip. A high refractive index is also advantageous in radiation-detecting semiconductor chips.

The refractive indices are determined with a refractometer, with which the temperature may be read off or regulated. The refractive indices are determined at the sodium D line wavelength (approx. 589 nm) and at a temperature of 20° C. The so-called $n_D^{20}$ is thus stated.

The inorganic-organic hybrid material may contain at least 20 wt. %, in particular at least 30 wt. %, of titanium and/or zirconium (wt. %=weight percent). The inorganic-organic hybrid material may contain $\geq 40$ wt. % and in particular $\geq 50$ wt. % of titanium and/or zirconium, titanium being used in particular.

The indication of the titanium and/or zirconium content relates to the proportion by weight of titanium and/or zirconium atoms (generally present as Ti(IV) or Zr(IV)) in the inorganic-organic hybrid material. Oxygen atoms or other ligands are not taken into account. With a high titanium and/or zirconium content it is possible to achieve a high refractive index for the patterned layer.

The patterned layer may be arranged directly on the first major face of the active layer. The patterned layer may in particular adhere well to the active layer or the semiconductor materials in the active layer without the need for adhesives or a separate adhesive layer. In this way, when fabricating the semiconductor chip it is possible to dispense both with adhesives and with the step of applying adhesives between active and patterned layer. This allows production costs for such a semiconductor chip to be lowered.

Good adhesion of the patterned layer (directly) on the active layer may be put down in particular to the inorganic constituents in the inorganic-organic hybrid material. Due to the good adhesion, the patterned layer is insensitive to mechanical stress such that even filigree three-dimensional patterns may exhibit good stability. Since the material for outcoupling and/or incoupling radiation is at least in part an inorganic-organic hybrid material, the patterned layer is not brittle despite its resistance and hardness. This property may be ascribed in particular to the organic constituents. Thus, the three-dimensional patterns may exhibit a higher breaking strength than is the case with conventional components in which patterns consist of a (brittle) semiconductor material. As a result of the high mechanical resistance of the patterned layer, the underlying active layer of the semiconductor chip is also protected such that the semiconductor chip has a longer storage life.

We also provide a method of producing a semiconductor chip comprising:
  (a) providing a body comprising the active layer with first and second major faces;
  (b) applying a coating material to the first major face;
  (c) patterning the coating material; and
  (d) curing the coating material to yield the inorganic-organic hybrid material, thereby forming the patterned layer.

The body may be the size of a chip such that an individual semiconductor chip is fabricated by the method. The body may also be larger such that a plurality of semiconductor chips may be fabricated in parallel. Such a body may comprise mesa etching, by which the body may be easily singulated (divided). The body may be a wafer.

The method does not use an etching process, in particular no etching into the active layer, to produce the three-dimensional patterns on the surface of the semiconductor chip. As explained above, no or fewer crystal defects in the active layer are concealed or indeed made worse than is the case in conventional methods using etching. This in particular improves the quality of the active layer and minimizes the number of semiconductor chip fabrication rejects.

The method is in particular simple and inexpensive to carry out since it requires both fewer operations and fewer materials and/or chemicals than a conventional method. In a conventional method, based on photolithography with an etch step, a photoresist is first applied and then patterned. With the patterns in the photoresist as a mask, etching into an active layer is then performed, the remaining photoresist then being removed again thereafter. For this procedure, an active layer must exhibit a high layer thickness to avoid puncturing during etching. In contrast, our method merely involves application, patterning and curing a coating material. The active layer, which is complex and costly to produce, therefore remains fully in the semiconductor chip.

In method step (d) of our method, three-dimensional patterns are formed which may exhibit the properties described above. The patterns may be formed with high resolution, for example. In contrast to a conventional method with an etch step, our method avoids rounding effects which may interfere with the outcoupling or incoupling of light, thereby improving the outcoupling and/or incoupling of radiation.

The body provided in method step (a) may be obtained, for example, by producing an active layer epitaxially on a monocrystalline substrate. A barrier layer and a reflective layer may then be produced on the second major face, for example. The substrate is then removed such that the first major face is exposed.

In method step (c), the coating material exhibits an elevated temperature during patterning. The elevated temperature may be room temperature (25° C.) to 100° C. and in particular 40 to 80° C. To this end, heating may be performed before or during method step (c). The coating material may therefore fill the spaces in the stamp well such that the three-dimensional patterns may be formed with high resolution.

The materials or indeed the production method for the stamp used are not limited to the application.

A silicon stamp may be used, for example, which comprises a patterned layer of gallium nitride on its surface. Such a stamp is simple and inexpensive to produce. The stamp may for example, be arranged on a piston or a roller. The stamp may also be a constituent of a flexible sheet or a film as is the case, for example, in Obducat's IPS® method or in Philips' SCIL® method. A plurality of stamps may be used in parallel.

The method steps (c) and (d) may be carried out together. This may simplify the method, since the stamp may be more readily detached after curing the coating material.

The method steps (c) and (d) may therefore be performed in a manner similar to nanoimprint lithography (NIL). In contrast to conventional NIL, the patterns produced are not, however, used as a mask for an etching process, but rather they remain in the semiconductor chip as a patterned layer.

In method step (d) irradiation and/or heating may be used for curing purposes.

In method step (d), the coating material may be irradiated with UV radiation to cure it. Infrared, beta or gamma radiation may alternatively be used. Radiant energy of 0.5 to 12 $J/cm^2$ may be used for irradiation purposes. The radiant energy used may depend on the layer thickness of the coating material. For example, 8 $J/cm^2$ of radiation may be used for a layer thickness of 0.8 µm.

In method step (d), heating to 80 to 400° C., in particular to 150 to 350° C. may be performed for curing purposes. Heating may proceed in a single stage or multiple stages. Curing may, for example, proceed in two stages, heating being performed in a first step initially to 80 to 150° C., for example, for 2 min, and in a second step to 150° C. to 350° C.

The stamp used in method steps (c) and (d) may be transparent to the radiation used for curing. Advantageously, therefore, the radiation source for the radiation used for curing may be arranged downstream of the stamp. This results in uniform curing of the coating material to yield the inorganic-organic hybrid material. A heating device may likewise also be arranged in or downstream of the stamp.

The coating material may be applied in method step (b) by spin-on deposition, spraying or spin coating. The coating material may also be applied using another, similar method. The coating material may be applied directly to the active layer.

The coating material may be applied in method step (b) as a layer with a layer thickness of 0.2 to 1.5 µm, in particular 0.3 to 1 µm, for example, 0.8 µm. The coating material therefore exhibits a smaller layer thickness than the patterned layer. In method step (c), the coating-material is patterned, in that it is deformed and therefore the layer thickness is increased in the region of the patterns.

Either a first or a second coating material may be applied as coating material in method step (b). The term "coating material" is used for both the first and second coating materials.

The first coating material may comprise or consist of:
a hydrolytic condensation product comprising organofunctional silanes with crosslinkable organic substituents,
a crosslinkable organic prepolymer and
an organic solvent.

The hydrolytic condensation product and crosslinkable organic prepolymers have already been described above. The solvent allows the consistency of the first coating material to be adjusted as desired such that it is easy to process. Such a first coating material may be used to form a patterned layer comprising or consisting of an inorganic-organic hybrid material.

The organic solvent in the first coating material may be selected from a group comprising an alcohol, an ether, a monoether of a diol or of a triol, an ester, a carboxylic acid and combinations of the solvents. The organic solvent may, for example, be selected from a group comprising methanol, ethanol, 1-propanol, 2-propanol, 1,2-propanediol, 1-butanol, 2-butanol and 1,2-butanediol, propylene glycol monoethyl ether, 1-methoxy-2-propanol, acetic acid and a combination of the solvents. As a rule, dried solvents are used which contain only little or no water.

The first coating material may consist for the most part or completely of the hydrolytic condensation product, at least one organic prepolymer, at least one organic solvent. "For the most part" here means at least a proportion of 95 wt. % of the total first coating material.

The first coating material may be provided in a further method step in that first of all a hydrolytic condensation product is produced from the above-described condensable compounds using a sol-gel method. In a second step, the hydrolytic condensation product is then mixed with at least one crosslinkable organic prepolymer and with at least one organic solvent. Such a first coating material can be stored for at least several months without quality loss. Commercial coating materials such as, for example, Amonil® made by Amo GmbH, may also be used.

Alternatively, a second coating material may comprise a second hydrolytic condensation product. The second hydrolytic condensation product may be produced using a sol-gel method as has already been described above. The second coating material may comprise an organic solvent as has already been described above for the first coating material. The solvent allows the consistency of the first second material to be adjusted as desired such that it is easy to process. The second coating material may consist completely of the second hydrolytic condensation product and an organic solvent. The second coating material may take the form, for example, of a commercially obtainable mixture for producing a so-called "spin-on" glass.

In method step (b), the coating material may have a viscosity of ≤5 Pa*s, in particular of ≤2 Pa*s, on application. The coating material may have a viscosity of ≤0.2 Pa*s, for example, 0.05 Pa*s. The low viscosity of the coating material simplifies application of the coating material and results in good wetting of the active layer with the coating material. This may result in a uniform, thin layer. The desired viscosity may be adjusted by way of the solvent. The coating material may contain up to 60 wt. %, in particular up to 50 wt. %, of solvent.

The coating material used in method step (b) may contain nanoparticles containing or consisting of $TiO_2$ and/or $ZrO_2$. These nanoparticles may be bonded at least in part to the inorganic-organic hybrid material during curing in method step (d).

The coating material may be heat-treated in a further method step prior to the patterning in method step (c). At least part of the solvent is then removed and the viscosity of the coating material is increased. Partial crosslinking may then proceed at this early stage. After heat treatment, the coating material may exhibit a plastic, viscous consistency. Heat treatment may be performed in a single stage or also in multiple stages. For example, heating to 110° C. may first be performed for 2 min, to remove solvent. The coating material may then be exposed with UV radiation, for example, and at the same time patterned with a stamp.

The body used in the method may be divided in a further method step after method step (b) and before method step (c). This may be achieved, for example, as a result of mesa etching produced beforehand or already present in the body. The body may, for example, be divided down to the size of one semiconductor chip such that method steps (c) and (d) are performed separately for each semiconductor chip. It is also possible to singulate the body after method step (d).

Photolithography may be performed in a further method step (e) following method step (c). In this way further, locally defined roughening may be achieved. As described above, for example, a coating material on a body, for example, a wafer may be patterned and further roughening may be performed subsequently by photolithography. This may take place with alignment or adjustment to patterns on the body intended, for example, for electrical contacting.

The patterning in method step (c) may proceed with alignment or adjustment of a stamp to patterns on the body, as described above. A transparent stamp may in particular be used for this purpose.

In a further method step, a passivation layer may be applied at least in part to the body or to the semiconductor chip. In this way, the semiconductor chip may be protected from harmful environmental influences, for example, diffusing moisture or oxygen, thereby increasing the service life and the resistance of the semiconductor chip. Such a passivation layer may be produced, for example, by plasma-enhanced chemical vapor deposition (PECVD).

An optoelectronic component may be provided comprising a semiconductor chip. The shortened term "component" is hereinafter also used for the optoelectronic component.

The advantages described above for the semiconductor chip may also be achieved for the optoelectronic component.

The component may take the form of a radiation-emitting or radiation-detecting component. The component may comprise further constituents as are conventionally present in optoelectronic components. Examples of radiation-detecting components are sensors or photovoltaic elements such as, for example, solar cells. A radiation-emitting component will be described below as an example of a component.

The component may comprise a housing with a recess in which the semiconductor chip may be arranged. The recess may be filled in part or completely with a potting compound of a polymer material such as, for example, a silicone and/or an epoxy resin. The component may further comprise converter materials in the beam path of the active layer which convert the radiation emitted by the semiconductor chip at least in part into further radiation of another, longer wavelength. The component may emit radiation with any desired color appearance, in particular with a white color appearance.

The component may, for example, comprise a small plate-form conversion element comprising converter materials and is arranged in the vicinity of or on the semiconductor chip ("chip-level conversion"). Alternatively, particles containing or consisting of the converter material may also be distributed in the potting compound. A conversion element may also be arranged at a certain distance, for example, >750 µm from the semiconductor chip ("remote phosphor conversion"). The emitted radiation may also be coupled into a light guide body and then emitted, after any possible conversion.

In the component the semiconductor chip may be contacted at the top, for example, via a bonding wire in conjunction with a bond pad. A reflective layer on the bottom of the semiconductor chip may serve for electrical contacting. Moreover, the component may comprise electrically conductive connections which may lead out of the housing and serve to electrically contact the semiconductor chip.

Our chips, components and methods are illustrated in greater detail below with reference to examples and drawings. The same reference numerals in each case indicate the same elements in the individual figures. The relationships between the elements are not shown to scale, however, but rather individual elements may be shown on an enlarged scale and/or schematically to assist in understanding.

Figure 1:
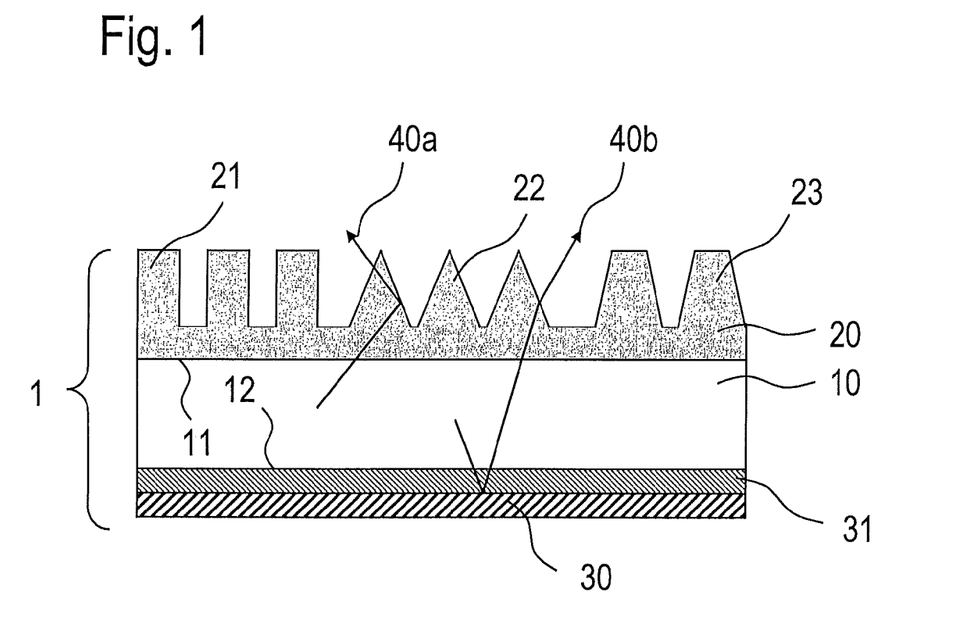
FIG. 1 shows an example of our optoelectronic semiconductor chip.

FIG. 1 shows an optoelectronic semiconductor chip 1 comprising an active layer 10. The active layer 10 includes a first major face 11 and a second major face 12 and comprises an electroluminescent semiconductor material, for example, InGaN. The active layer 10 may also take the form of a layer stack. The active layer 10 is grown epitaxially in part or completely. The active layer 10 has a layer thickness of 0.4 to 2 µm, in particular 0.6 to 1.5 µm such as, for example, 1 µm. The semiconductor chip 1 may, for example, be a thin-film light-emitting diode chip.

A patterned layer 20 is arranged directly on the planar first major face 11. Thus, no three-dimensional patterns are produced in the active layer 10. The patterned layer 20 has a layer thickness of 0.6 to 1.5, for example, 1.1 µm wherein the layer thickness amounts to at least 5 nm and in particular at least 20 nm in the regions between the three-dimensional patterns. Any defects in the active layer 10 are closed or sealed at least in part by the patterned layer 20. The patterned layer 20 consists of an inorganic-organic hybrid material and comprises ≥40 wt. %, in particular ≥50 wt. %, of titanium (present in the form of Ti(IV)). The refractive index of the patterned layer 20 is ≥2.0, for example, 2.2. In this way the radiation may pass with little total reflection through the layer interface between active layer 10 and patterned layer 20 and then be outcoupled.

The patterned layer 20 comprises three-dimensional patterns formed with a resolution of 0.08 to 2.0 µm and in particular 0.5 to 2.0 µm and advantageously do not exhibit any rounding effects. As representatives of possible three-dimensional figures, FIG. 1 shows cuboidal patterns 21, pyramidal patterns 22 and prismatic patterns 23. As explained above, the three-dimensional patterns are, however, not limited to these shapes. In particular, three-sided pyramids 22 may allow effective outcoupling (or incoupling) of radiation. Hexagonal pyramids (not shown) are likewise of interest due to their optimum surface coverage. A region may be recessed in the patterned layer in which the active layer may be electrically contacted (not shown).

A barrier layer 31 and a reflective layer 30 comprising silver are produced on the second major face 12. The barrier layer 31 serves to stop silver from migrating, and may comprise TiWN. The reflective layer 30 and/or the barrier layer 31 may be patterned (not shown).

To represent a radiation-emitting semiconductor chip 1, FIG. 1 shows a ray 40a which is outcoupled directly and a ray 40b which is outcoupled after reflection at the reflective layer 30.

As described above, the semiconductor chip 1 shown may be fabricated particularly simply, cheaply and with few rejects and exhibits a long storage life and/or service life.

Figure 2:
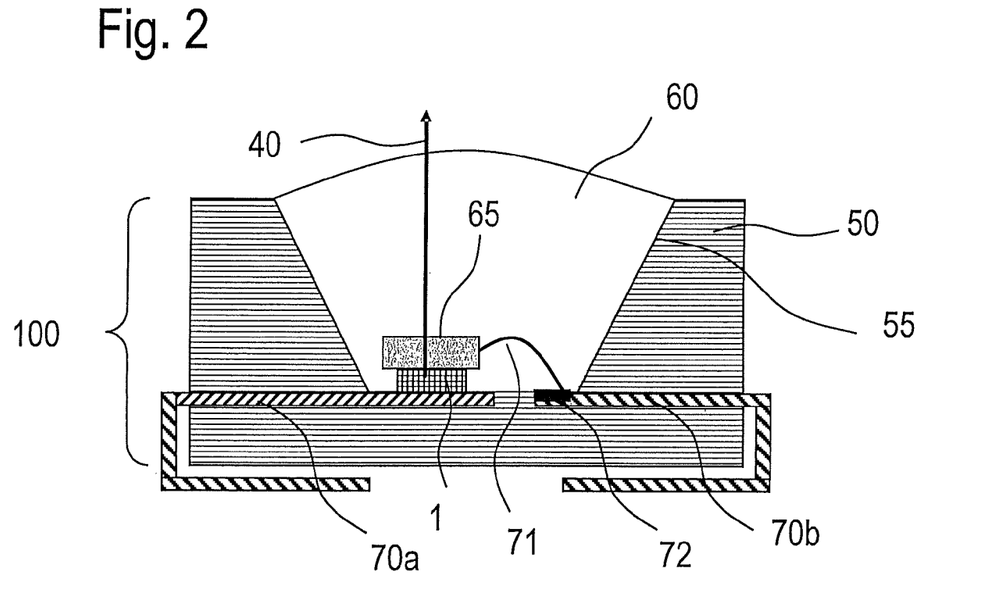
FIG. 2 shows an example of our optoelectronic component.

FIG. 2 shows an optoelectronic component 100 comprising a semiconductor chip 1. The component 100 comprises a housing 50 with a recess 55 in which the semiconductor chip 1 is arranged. The component 100 contains a converter material 65 arranged in the form of a small plate on the semiconductor chip 1 and in the beam path 40. The recess 55 may be filled with a potting compound 60 of silicone. At the top the semiconductor chip 1 connects to a bond pad 72 via a bonding wire 71. Electrically conductive connections 70a, 70b may lead out of the housing 50 and serve in electrical contacting of the semiconductor chip 1. In operation the component 100 may emit radiation with any desired color appearance, in particular white.

As described above, the component 100 may also be made without converter material 65 or comprise a differently arranged converter material 65.

The chips, components and methods described herein are not restricted by the description given with reference to the examples. Rather, this disclosure encompasses any novel feature and any combination of features, including in particular any combination of features in the appended claims, even if the feature or combination is not itself explicitly indicated in the claims or examples.

The invention claimed is:

1. An optoelectronic semiconductor chip comprising:
   an active layer with a first and a second major face, comprising a semiconductor material which emits or receives radiation when the semiconductor chip is in operation;
   a patterned layer comprising three-dimensional patterns for outcoupling or incoupling radiation and arranged on the first major face in a beam path of the radiation; wherein the patterned layer comprises an inorganic-organic hybrid material comprising 1) a hydrolytic condensation product containing organofunctional silanes with organic substituents which are at least in part crosslinked with the organic prepolymer, and 2) an organic prepolymer and the inorganic-organic hybrid material contain at least 20 wt. % of titanium and/or zirconium that is chemically bonded to the inorganic-organic hybrid material.

2. The semiconductor chip according to claim 1, further comprising a reflective layer arranged on the second major face of the active layer.

3. The semiconductor chip according to claim 1, wherein the three-dimensional patterns for outcoupling or incoupling radiation are only on top of the first major face present in the patterned layer.

4. The semiconductor chip according to claim 1, wherein the active layer has a layer thickness of 0.4 to 2 µm.

5. The semiconductor chip according to claim 1, wherein the patterned layer has a layer thickness of 0.5 to 3 µm.

6. The semiconductor chip according to claim 1, wherein the three-dimensional patterns are formed with a resolution of ≤3 µm.

7. The semiconductor chip according to claim 1, wherein the patterned layer has a refractive index of ≥1.6.

8. The semiconductor chip according to claim 1, wherein the patterned layer is arranged directly on the active layer.

9. A method of producing the semiconductor chip according to claim 1, comprising:
   (a) providing a body comprising the active layer, wherein the active layer comprises the first and second major faces;
   (b) applying a coating material to the first major face;
   (c) patterning the coating material; and
   (d) curing the coating material to yield the inorganic-organic hybrid material, thereby forming the patterned layer.

10. The method according to claim 9, wherein in step (c) a stamp patterns the coating material.

11. The method according to claim 9, wherein steps (c) and (d) are performed together.

12. The method according to claim 9, wherein the coating material is applied in step (b) as a layer with a layer thickness of 0.2 to 1.5 µm.

13. An optoelectronic component comprising a semiconductor chip according to claim 1.

* * * * *

UNITED STATES PATENT AND TRADEMARK OFFICE
CERTIFICATE OF CORRECTION

PATENT NO.          : 9,147,806 B2                                            Page 1 of 1
APPLICATION NO.     : 13/825156
DATED               : September 29, 2015
INVENTOR(S)         : Bohm et al.

It is certified that error appears in the above-identified patent and that said Letters Patent is hereby corrected as shown below:

On the Title Page

At item (73) Assignee, Please change "OSRAM Opto Semiconductor GmbH" to
--OSRAM Opto Semiconductors GmbH--.

Signed and Sealed this
Ninth Day of August, 2016

Michelle K. Lee
*Director of the United States Patent and Trademark Office*